United States Patent
Shi et al.

(10) Patent No.: US 8,680,658 B2
(45) Date of Patent: Mar. 25, 2014

(54) CONDUCTIVE CLIP FOR SEMICONDUCTOR DEVICE PACKAGE

(75) Inventors: Lei Shi, Shanghai (CN); Kai Liu, Mountain View, CA (US); Ming Sun, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 900 days.

(21) Appl. No.: 12/130,663

(22) Filed: May 30, 2008

(65) Prior Publication Data

US 2009/0294934 A1    Dec. 3, 2009

(51) Int. Cl.
*H01L 23/495* (2006.01)

(52) U.S. Cl.
USPC .................................. 257/673; 257/E23.047

(58) Field of Classification Search
USPC ................................................. 257/673, 676
See application file for complete search history.

(56) References Cited

U.S. PATENT DOCUMENTS

| | | |
|---|---|---|
| 3,735,017 A | 5/1973 | Manning |
| 3,737,738 A | 6/1973 | Koenig |
| 3,842,189 A | 10/1974 | Southgate |
| 4,083,063 A | 4/1978 | Yu |
| 4,104,786 A | 8/1978 | Boah et al. |
| 4,418,470 A | 12/1983 | Naster |
| 4,996,582 A | 2/1991 | Nagahama |
| 5,028,987 A | 7/1991 | Neugebauer |
| 5,480,841 A | 1/1996 | Bickford |
| 5,532,512 A | 7/1996 | Fillion |
| 5,753,942 A | 5/1998 | Seok |
| 5,821,611 A | 10/1998 | Kubota |
| 5,859,387 A * | 1/1999 | Gagnon ........................ 174/531 |
| 5,864,169 A | 1/1999 | Shimura |
| 6,040,626 A * | 3/2000 | Cheah et al. .................. 257/735 |
| 6,136,702 A | 10/2000 | Chandross |
| 6,166,434 A | 12/2000 | Desai |
| 6,169,920 B1 | 1/2001 | Haak |
| 6,249,041 B1 | 6/2001 | Kasem |
| 6,249,061 B1 | 6/2001 | Roberts |
| 6,287,126 B1 | 9/2001 | Berger et al. |
| 6,292,140 B1 | 9/2001 | Osterman |

(Continued)

FOREIGN PATENT DOCUMENTS

JP    11-238938    8/1999

OTHER PUBLICATIONS

English-Language Abstract for JP 11-238938 Published Aug. 31, 1999, Matsushita Electric Ind Co Ltd.

*Primary Examiner* — Benjamin Sandvik
(74) *Attorney, Agent, or Firm* — Joshua D. Isenberg; JDI Patent

(57) ABSTRACT

A clip for a semiconductor device package may include two or more separate electrically conductive fingers electrically connected to each other by one or more electrically conductive bridges. A first end of at least finger is adapted for electrical contact with a lead frame. The bridges are adapted to provide electrical connection to a top semiconductor region of a semiconductor device and may also to provide heat dissipation path when a top surface of the fingers is exposed. A semiconductor device package may include the clip along with a semiconductor device and a lead frame. The semiconductor device may have a first and semiconductor regions on top and bottom surfaces respectively. The clip may be electrically connected to the top semiconductor region at the bridges and electrically connected to the lead frame at a first end of at least one of the fingers.

23 Claims, 10 Drawing Sheets

(56) References Cited

U.S. PATENT DOCUMENTS

| | | | |
|---|---|---|---|
| 6,294,787 B1 | 9/2001 | Schieferdecker | |
| 6,307,755 B1 | 10/2001 | Williams | |
| 6,316,827 B1 | 11/2001 | Asano | |
| 6,319,755 B1 * | 11/2001 | Mauri | 438/119 |
| 6,368,920 B1 | 4/2002 | Beasom | |
| 6,455,925 B1 | 9/2002 | Laureanti | |
| 6,465,276 B2 | 10/2002 | Kuo | |
| 6,479,888 B1 | 11/2002 | Hirashima | |
| 6,548,882 B1 | 4/2003 | Zwicknagl | |
| 6,624,522 B2 | 9/2003 | Standing | |
| 6,707,138 B2 * | 3/2004 | Crowley et al. | 257/676 |
| 6,724,067 B2 | 4/2004 | Bayraktaroglu | |
| 6,740,969 B1 | 5/2004 | Hirashima | |
| 6,774,466 B1 | 8/2004 | Kajiwara | |
| 6,777,800 B2 * | 8/2004 | Madrid et al. | 257/690 |
| 6,784,537 B2 | 8/2004 | Moriguchi | |
| 6,818,920 B2 | 11/2004 | De Leeuw | |
| 6,849,930 B2 | 2/2005 | Nakajima | |
| 6,881,074 B1 | 4/2005 | McLenaghan | |
| 6,919,644 B2 | 7/2005 | Uchida | |
| 7,126,187 B2 | 10/2006 | Aoki | |
| 7,230,322 B2 | 6/2007 | Funato | |
| 7,253,507 B2 | 8/2007 | Kouzuki | |
| 7,285,849 B2 | 10/2007 | Cruz | |
| 7,439,595 B2 | 10/2008 | Ueda | |
| 7,439,841 B2 | 10/2008 | Kim | |
| 7,442,635 B2 | 10/2008 | Das | |
| 7,495,323 B2 | 2/2009 | Germain | |
| 7,622,796 B2 | 11/2009 | Shi | |
| 7,633,140 B2 | 12/2009 | Luo | |
| 7,683,464 B2 * | 3/2010 | Sun et al. | 257/666 |
| 8,354,740 B2 * | 1/2013 | Liu et al. | 257/675 |
| 2001/0052535 A1 | 12/2001 | Zhu | |
| 2004/0080028 A1 | 4/2004 | Yanagisawa | |
| 2004/0124435 A1 | 7/2004 | D'Evelyn | |
| 2006/0012055 A1 | 1/2006 | Foong | |
| 2007/0045785 A1 * | 3/2007 | Noquil | 257/666 |
| 2007/0057368 A1 | 3/2007 | Ho | |
| 2007/0114352 A1 * | 5/2007 | Cruz et al. | 248/316.7 |
| 2007/0161151 A1 * | 7/2007 | Madrid et al. | 438/106 |
| 2007/0235341 A1 | 10/2007 | Mizohata | |
| 2008/0087992 A1 | 4/2008 | Shi | |

* cited by examiner

CONDUCTIVE CLIP FOR SEMICONDUCTOR DEVICE PACKAGE

FIELD OF THE INVENTION

This invention generally relates to semiconductor die packages and more particularly to the use of a source clip in a die package to provide electrical contact in a way that lowers spreading resistance and enhances heat dissipation.

BACKGROUND OF THE INVENTION

In semiconductor device packaging, a metallic clip is often used to provide electrical connections between a semiconductor die and a lead frame to which the die is mounted. For example, U.S. Pat. No. 6,624,522 discloses a metal oxide semiconductor (MOS) gated device wafer having a source side covered with a passivation layer, preferably a photosensitive liquid epoxy, or a silicon nitride layer, or the like. The wafer is coated by a spinning, screening, or otherwise depositing the liquid epoxy onto the wafer surface. The material is then dried and the coated wafer is exposed using standard photolithographic techniques to image the wafer and openings are formed in the passivation layer to produce a plurality of spaced exposed surface areas of the underlying source metal and a similar opening to expose the underlying gate electrode of each die on the wafer. The passivation layer acts as a passivation layer and can further act as a plating resist (if required) and as a solder mask, designating and shaping the solder areas.

The wafer is then sawn or otherwise singulated into individual die. The individual die are then placed source-side down and a U-shaped or cup shaped, partially plated drain clip is connected to the solderable drain side of the die, using a conductive epoxy or solder, or the like to bond the drain clip to the bottom drain electrode of the die. The bottoms of the legs of the drain clip are coplanar with the source-side surface (that is the tops of the contact projections) of the die. The outer surface of the die is then over molded in a mold tray. After molding, the devices are tested, laser marked and sawn into individual devices. However, the devices are not compatible with standard pinout leadframe.

U.S. Pat. No. 6,777,800 discloses semiconductor die package including a vertical power MOSFET having a gate region and a source region positioned at a bottom surface and a drain region positioned at a top surface. A gate lead electrically coupled to the gate region and a source lead electrically coupled to the source region. A drain clip is electrically coupled to the drain region. A non-conductive molding material encapsulates the semiconductor die, wherein a surface of the drain clip is exposed through the non-conductive molding material. However, this semiconductor die package requires flip-chip process.

US Patent Application Publication 20080087992 discloses a semiconductor package having a bridged plate interconnection. The package utilizes a bridged source plate interconnection having a bridge portion, valley portions disposed on either side of the bridge portion, plane portions disposed on either side of the valley portions and the bridge portion, and a connection portion depending from one of the plane portions. The bridge portion is disposed in a plane above the plane of the valley portions while the plane portions are disposed in a plane intermediate the plane of the bridge portion and the plane of the valley portions. During encapsulation, bonding material flows under the bridge portion and provides mechanical strength to the bridged source plate interconnection.

It would be desirable to develop a semiconductor device package that allows efficient heat dissipation, and has low resistance connections to the semiconductor device. It would be further desirable to develop a package that is compatible with standard semiconductor pinouts. It would be further desirable to make a semiconductor device package that has a rugged stress release structure, and has the flexibility to be used with differently sized semiconductor devices.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

Figure 1A:
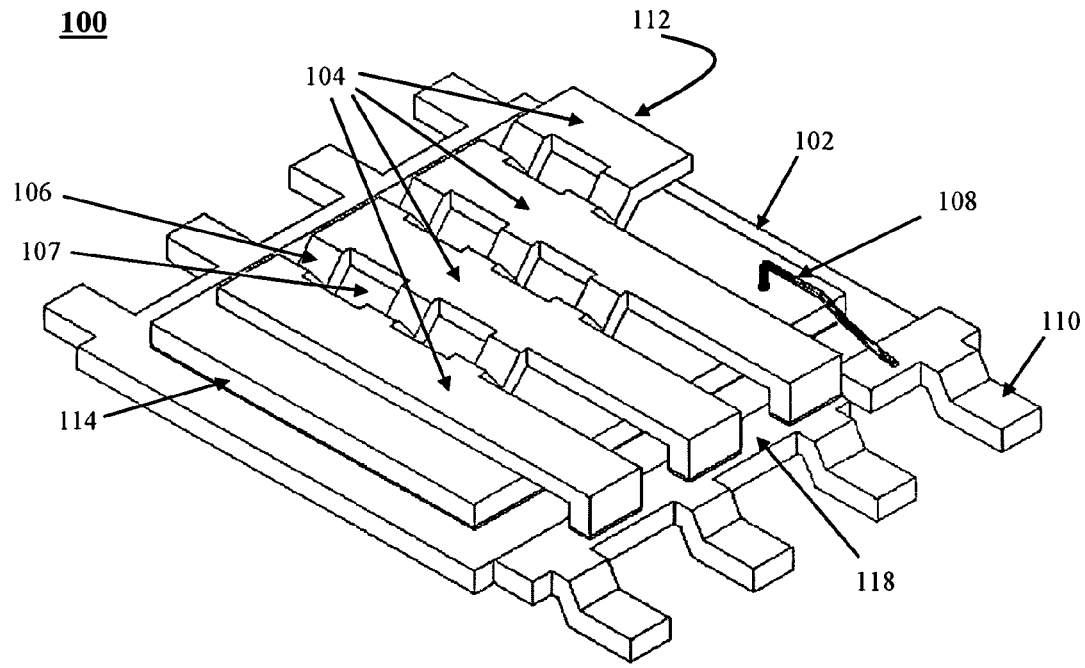
FIG. 1A is a perspective view of a semiconductor device package having a V-shaped clip with non-exposed gate wire according to an embodiment of the present invention.

In these drawings, common features shown in the figures are indicated by common reference numerals.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1B:
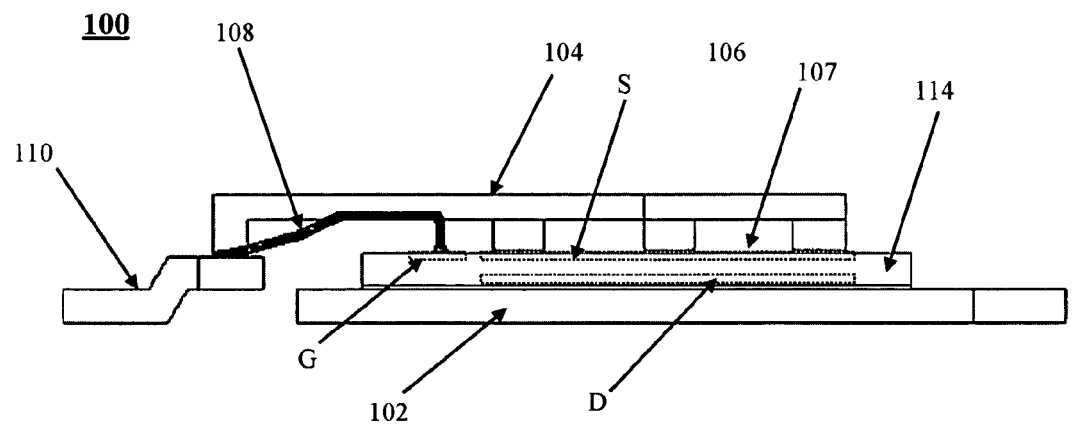
FIG. 1B is a side elevation view of the device package of FIG. 1A.

According to one embodiment of the present invention, as depicted in FIGS. 1A-1B, a semiconductor device package 100 may have a V-shaped clip with a non-exposed gate wire bonded to a lead frame. As shown in FIG. 1A, the device package 100 includes a fused lead frame 102 and a semiconductor device 114, e.g., a MOS device having a top source S, a top gate G and a bottom drain D located on top of the lead frame 102 with the bottom drain D contacting the main portion of the lead frame 102. By way of example, and not by way of limitation, the lead frame 102 may be fused or non-fused. As used herein, a fused lead frame refers to a lead frame in which the source leads are fused together. Conversely, a non-fused lead frame refers to a lead frame in which the source leads are individual, non-fused pieces, (as will be seen in FIGS. 4A-E). In either case, the source leads do not electrically contact the main part of the lead frame, as can be clearly seen in FIG. 1B.

According to an embodiment of the present invention, the semiconductor device package 100 includes a clip 112, which includes separate parallel conductive fingers 104 that are electrically and mechanically connected to each other by conductive bridges 106 adapted to make electrical contact with a top source of the semiconductor device 114. This configuration provides for multiple electrically parallel paths that are separated from each other by gaps 107 between adjacent fingers 104 and adjacent bridges 106. By way of example and not by way of limitation, each bridge 106 may be approximately in the shape of a "V" with the base of the "V" providing electrical contact to a source pad at the top of the device 114. Electrical current may flow from the fingers to the top source or vice versa along a path in or out the base of the "V" through the sides and tops of the "V" and along the fingers 104. The bridges 106 may have some other shape, e.g., "U" shape that provides electrical connections to the source and to adjacent fingers 104. In this text "V" shape will describe a general inverted-arch shape, which includes but is not limited to "U" shape and other equivalents. Preferably, the shape of the bridges 106 takes into consideration the distance from the fingers 104 to the semiconductor device 114 surface, the gap between fingers 104, and the contact area on the semiconductor device 114 surface. In a preferred embodiment, the clip 112 is formed from a single piece of material, e.g., by stamping from a single sheet of metal.

By way of example, and not by way of limitation, the semiconductor device 114 may be a metal-oxide semiconductor (MOS) device having a top source and gate and a bottom drain. In such an example, the clip 112 is sometimes referred to as a "source clip". The clip 112 may be electrically connected to the top source of the device 114 only at the bridges 106. The base of each "V" may be flattened to facilitate electrical connection between the bridge 106 and the top source of the device 114. A top gate of the device 114 may be electrically connected to the gate lead 110 by a bond wire 108. The conductive fingers 104 may exhibit a bend out of the horizontal plane of the clip 112 in order to vertically contact with a fused source lead 118, which saves the encapsulation space for the semiconductor device package 100.

Figure 1C:
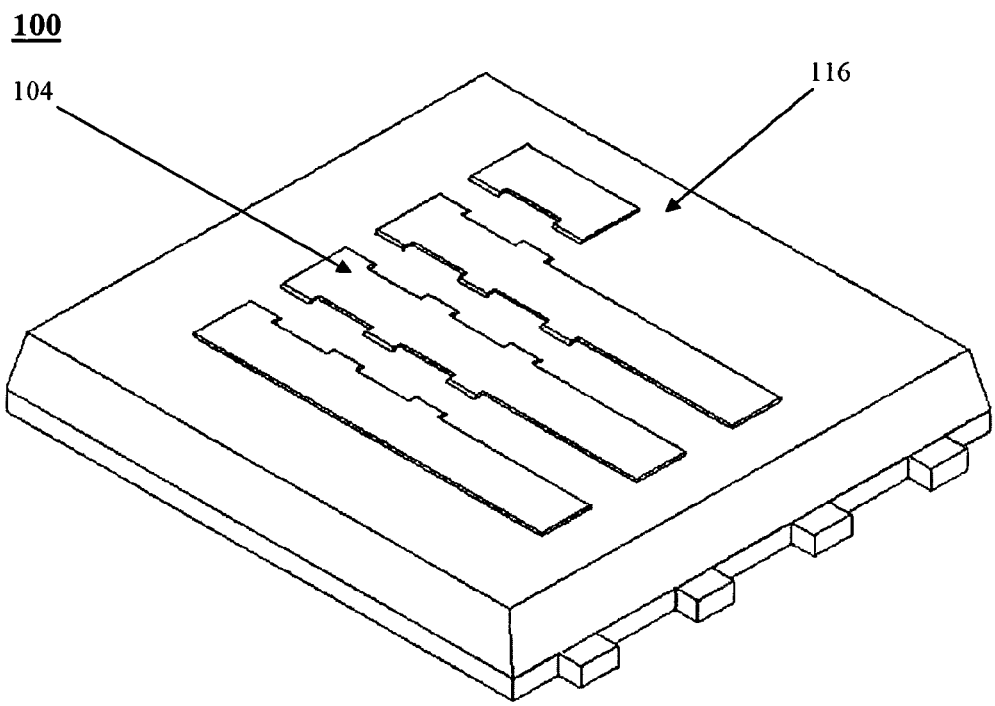
FIG. 1C is a perspective view of the device package of FIG. 1A encapsulated with molding compound.

As shown in FIG. 1C, the semiconductor device package 100 may be encapsulated with molding compound 116 and leave the tops of the fingers 104 exposed. In this example, however, the bond wire 108 is completely covered with the molding compound 116. By way of example, and not by way of limitation, the molding compound 116 may be an epoxy.

Thermal expansion mismatch between silicon and metal may cause stress or even cracking. This problem may be worse if there is a large single area of contact between the two. A solution can be used to break the contact area into several smaller pieces, as is done in the semiconductor device 100. The clip 112 provides a stress release structure between the clip 112 and the MOS device 114 through the multiple contact points provided by the bridges 106, which will help much to make the top surface of the fingers 104 when the clip 112 is encapsulated with the molding compound 116. The bridges 106 may also add mechanical strength to the package, as it gives the molding compound 116 more features to anchor and at different angles.

In the clip 112, electrical contact to the fingers 104 by way of the bridges 106 reduces the spreading resistance. Spreading resistance refers to an electrical resistance resulting from spreading of electrical current in a conductor as it flows laterally from a point of contact with the conductor. Spreading resistance may be reduced by distributing multiple parallel conductive paths to channel electric current throughout the contact pad at the top of the semiconductor device 114. A clip of the type shown in FIGS. 1A-1C can have a lower electrical resistance than if the contact points were bunched closely together or if the contact points were fewer in number, as in the source clip configuration shown in US Patent Application Publication 20080087992. In the example shown in FIGS. 1A-1C, the clip 112 comprises three long fingers 104 and a shorter finger 104. The shorter finger 104 accommodates the gate region while increasing the amount of exposed area and allowing more contacts through the bridges 106 for this particular example.

Another advantage of this invention is that it is compatible with standard semiconductor package pin outs and footprints. Thus this invention can be used in existing assemblies, without having to change the design of the circuit board or surrounding parts.

Figure 2A:
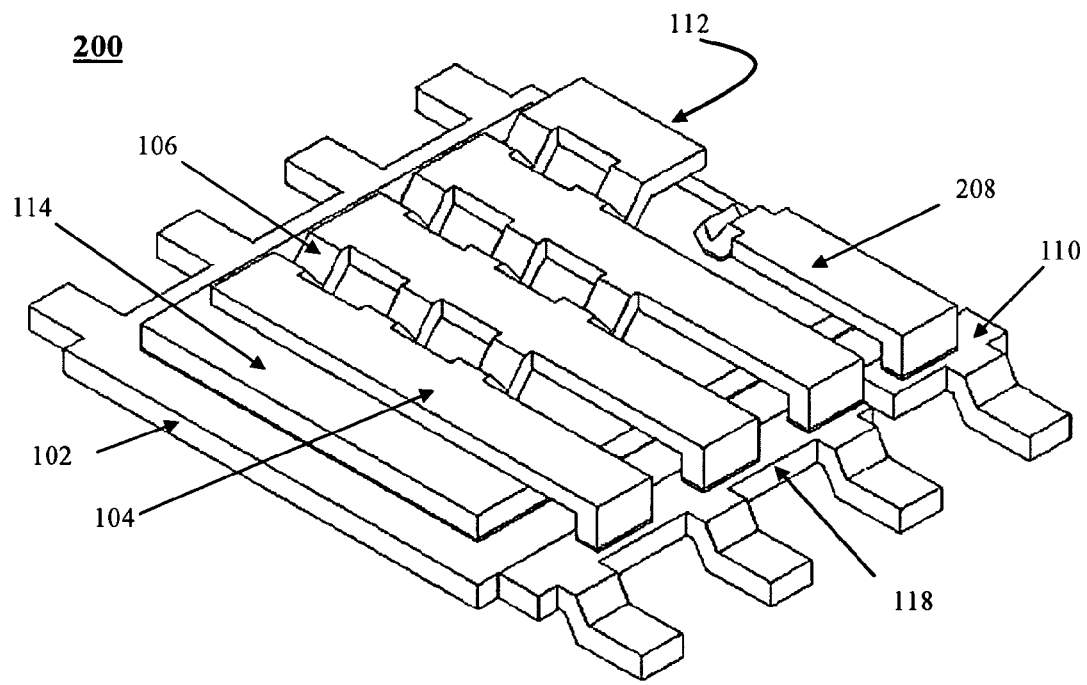
FIG. 2A is a perspective view of a semiconductor device package having a source clip and an exposed gate clip according to another embodiment of the present invention.
Figure 2B:
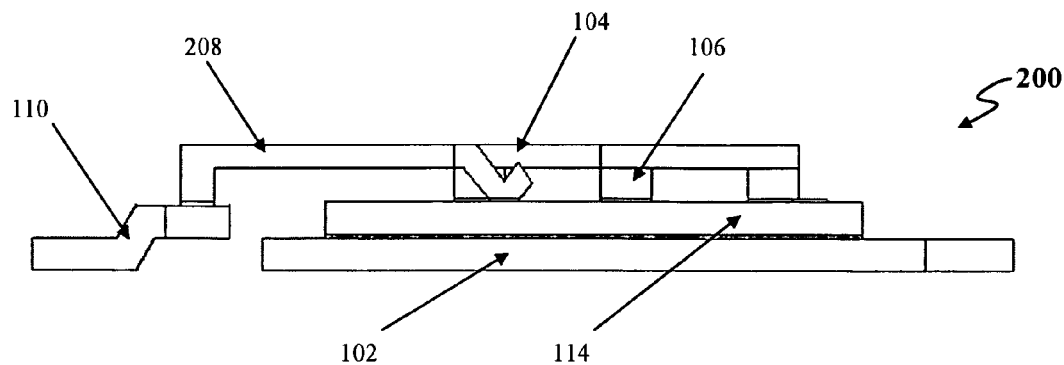
FIG. 2B is a side elevation view of the device package of FIG. 2A.
Figure 2C:
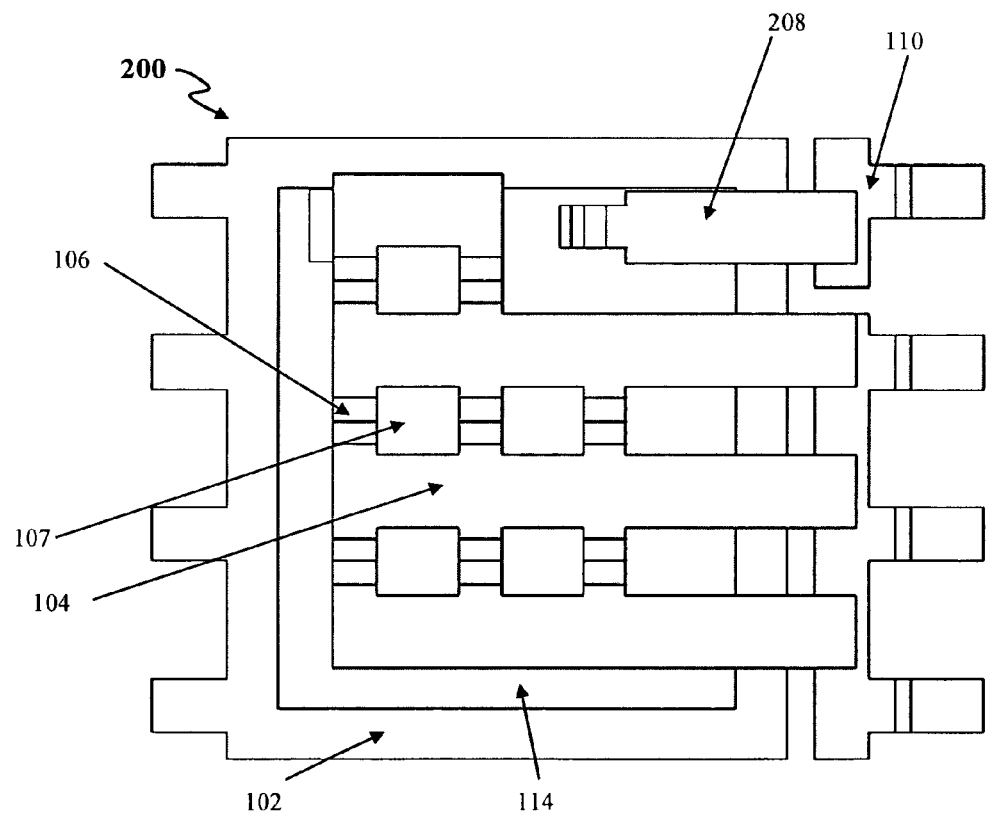
FIG. 2C is a top plan view of the device package of FIG. 2A.
Figure 2D:
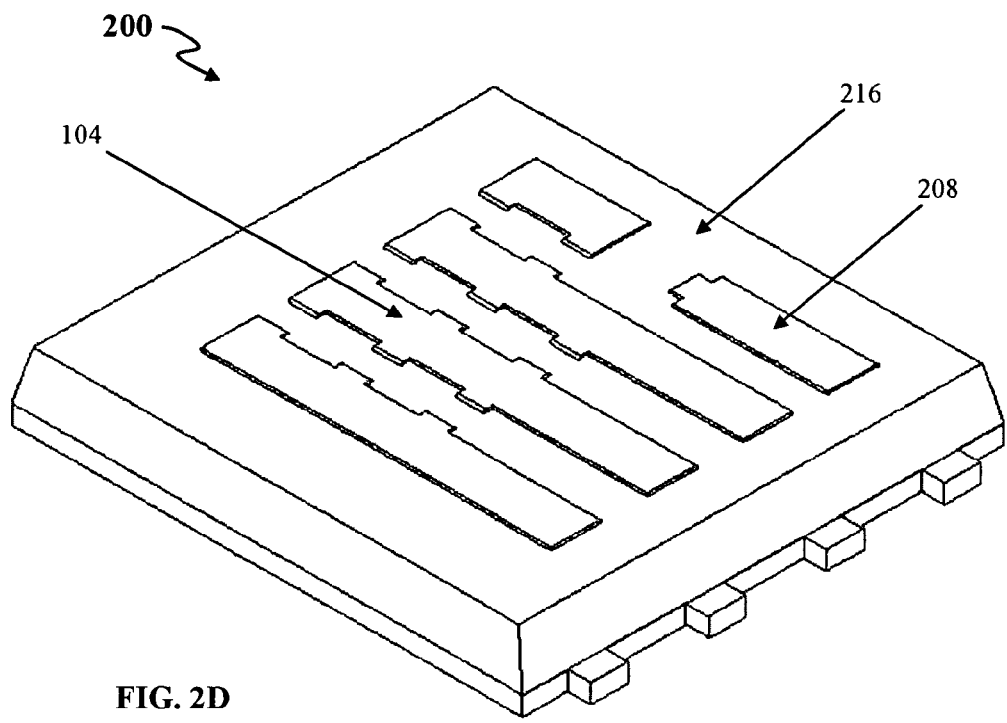
FIG. 2D is a perspective view of the device package of FIG. 2A encapsulated with molding compound.

FIGS. 2A-2D illustrate a semiconductor device package 200 according to a preferred embodiment of the present invention. The semiconductor device package 200 basically includes all the components of the semiconductor device package 100 described above and depicted in FIGS. 1A-1C, except that the gate bond wire 108 is replaced with a gate clip 208. The device package 200 includes a fused lead frame 102, a MOS device 114 having top source, top gate and bottom drain located on top of the lead frame 102 and a clip 112 having separate parallel conductive fingers 104 electrically connected to each other by conductive bridges 106. The clip 112 is electrically bonded to the top source of the MOS device 114 only at the bridges 106. As in FIGS. 1A-1C, the fingers 104 may exhibit a bend out of the plane of the clip 112 in order to vertically contact with the fused source lead 118. In this embodiment, the top gate is electrically connected to the gate lead 110 of the lead frame 102 by a gate clip 208. As may be seen from the side elevation view in FIG. 2B, the top surface of the gate clip 208 and the top surface of the clip 112 are coplanar in this example. FIG. 2D is a perspective view of the semiconductor device package 200 after covered with molding compound 216. As shown in FIG. 2D, the top surface of the clip 112 and the gate clip 208 are exposed.

Figure 3A:
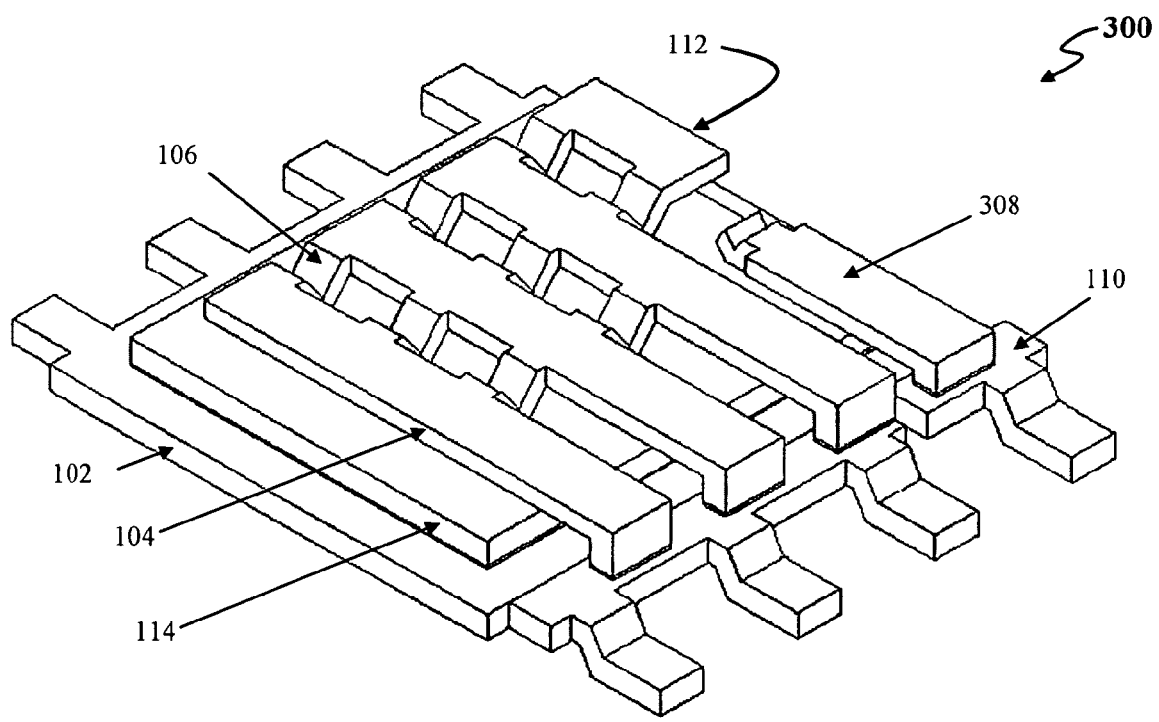
FIG. 3A is a perspective view of a semiconductor device package having a source clip and a non-exposed gate clip according to another embodiment of the present invention.
Figure 3B:
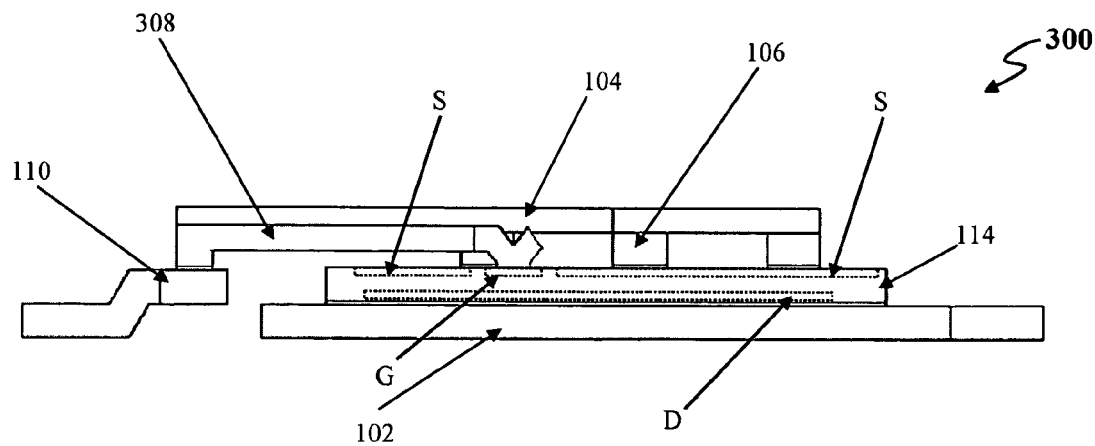
FIG. 3B is a side elevation view of the device package of FIG. 3A.
Figure 3C:
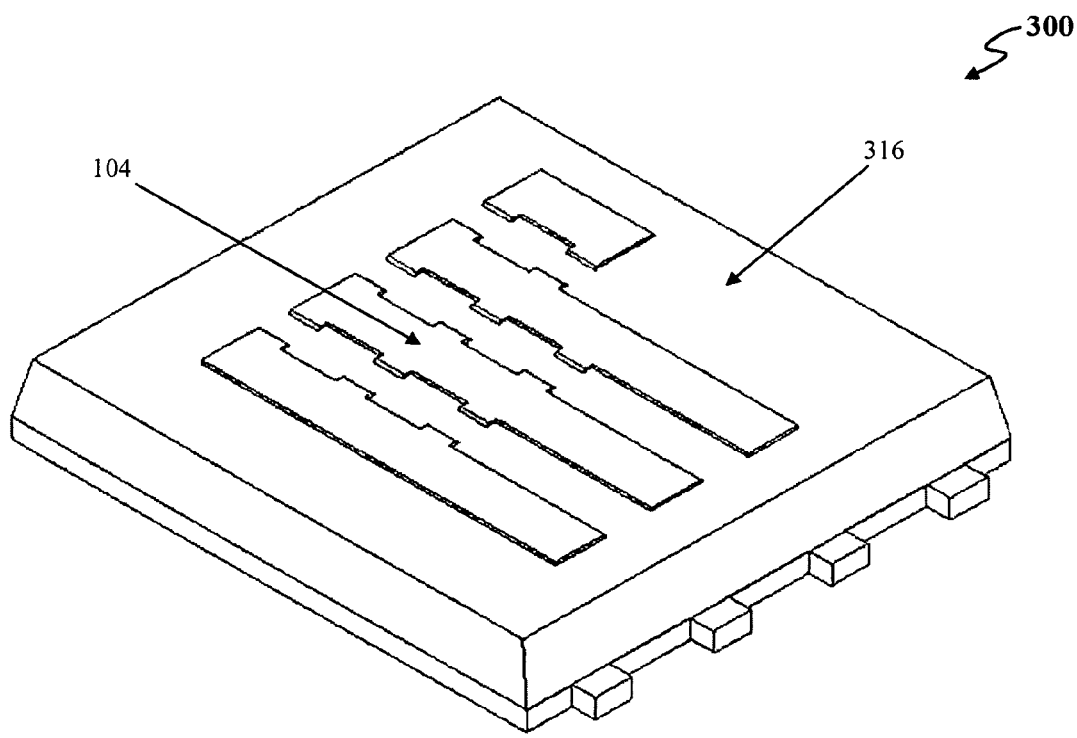
FIG. 3C is a perspective view of the device package of FIG. 3A encapsulated with molding compound.

FIG. 3A is a perspective view of a semiconductor device package 300 according to another embodiment of the present invention. This embodiment is a variation on the embodiment shown in FIGS. 2A-2D. The semiconductor device package 300 basically includes all the components of the semiconductor device package 200 shown above in FIGS. 2A-2D. In this embodiment, the top gate is electrically connected to a gate lead 110 of the lead frame 102 by a gate clip 308. However, as shown in FIG. 3B, the top surface of the gate clip 308 is below the top surface of the fingers 104 of the clip 112. As shown in FIG. 3C, when the semiconductor device package 300 is filled with molding compound 316, the top surface of the fingers 104 may be exposed while the gate clip 308 is covered with the molding compound 316 due to the differing heights of the clip 112 and gate clip 308.

Figure 4A:
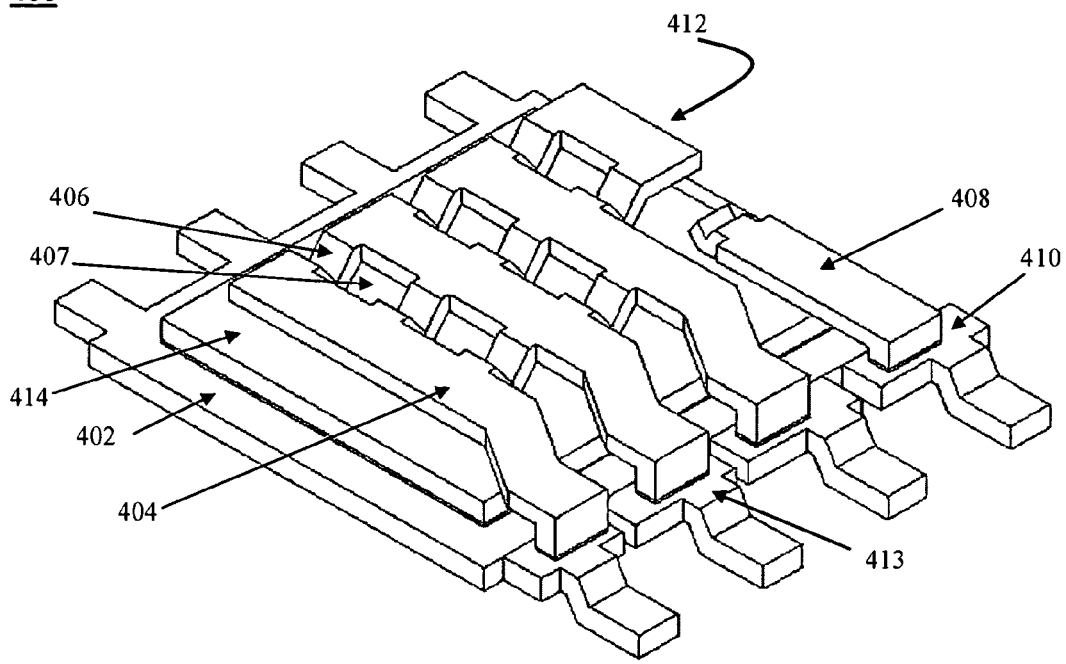
FIG. 4A is a perspective view of a semiconductor device package having a source clip with fingers matching with a non-fused leadframe according to another embodiment of the present invention.
Figure 4B:
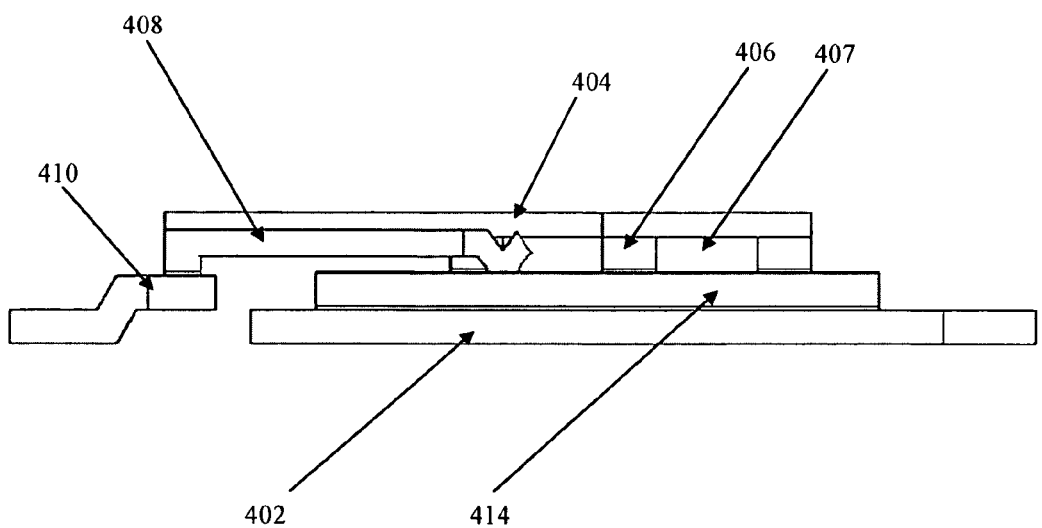
FIG. 4B is a side elevation view of the device package of FIG. 4A.
Figure 4C:
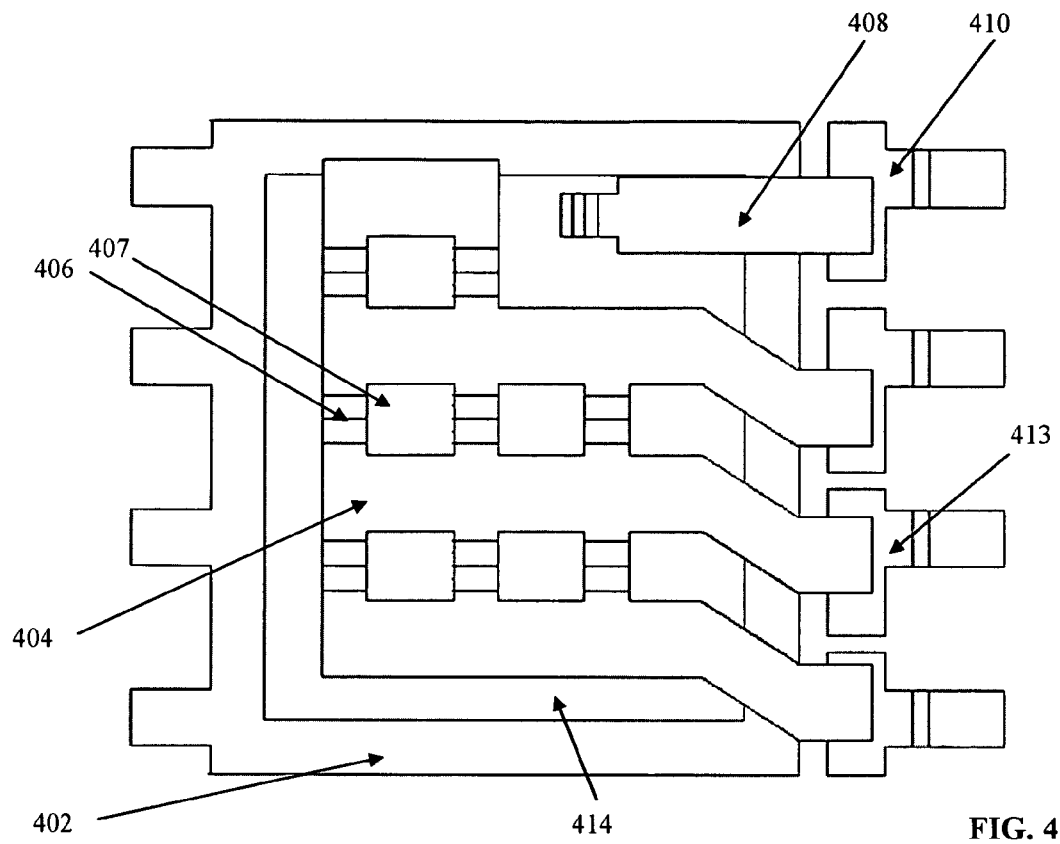
FIG. 4C is a top plan view of the device package of FIG. 4A.

FIGS. 4A-4D depicts a semiconductor device package 400 according to an embodiment of the present invention. By way of example, and not by way of limitation, the semiconductor device package 400 may include a non-fused lead frame 402, a semiconductor device 414 having a top source, a top gate and a bottom drain located on the non-fused lead frame 402, and a source V-shaped clip 412 electrically connected to the top source of the MOS device 414. The non-fused lead frame 402 includes non-fused source leads 413. The source clip 412 includes separate parallel conductive fingers 404 electrically connected to each other by conductive bridges 406. The source clip 412 is electrically coupled to the top source of the MOS device 414 only at the bridges 406. Adjacent fingers 404 and adjacent bridges 406 may be separated by gaps 407. The fingers 404 may exhibit a bend in a plane of the clip 412 between the bridges and the non-fused source leads 413 of the lead frame 402 in order to align the fingers 404 with the non-fused source leads 413. Furthermore, the fingers 404 may exhibit a bend out of plane of the clip 412 in order to contact with the non-fused source leads 413. The top gate of the MOS device is electrically connected to the gate lead 410 of the lead frame 402 by a gate clip 408. As shown in FIG. 4B, the top surface of the gate clip 408 may be recessed below the top surface of the fingers 404 of the clip 412. Alternatively (though not shown), the top surface of the gate clip 408 may be made coplanar with the top surface of the fingers 404 of the clip 412 and exposed top after the encapsulation with the molding compound 418.

Figure 4D:
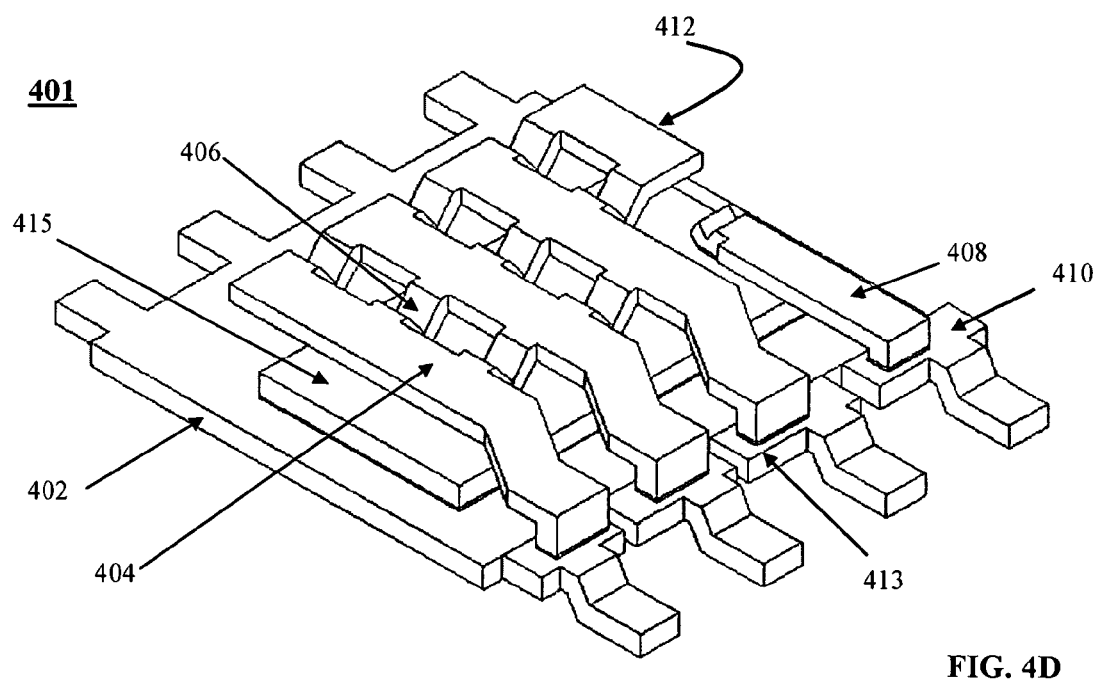
FIG. 4D is a perspective view of a semiconductor device package having a source clip with fingers matching with a non-fused leadframe according to another embodiment of the present invention.
Figure 4E:
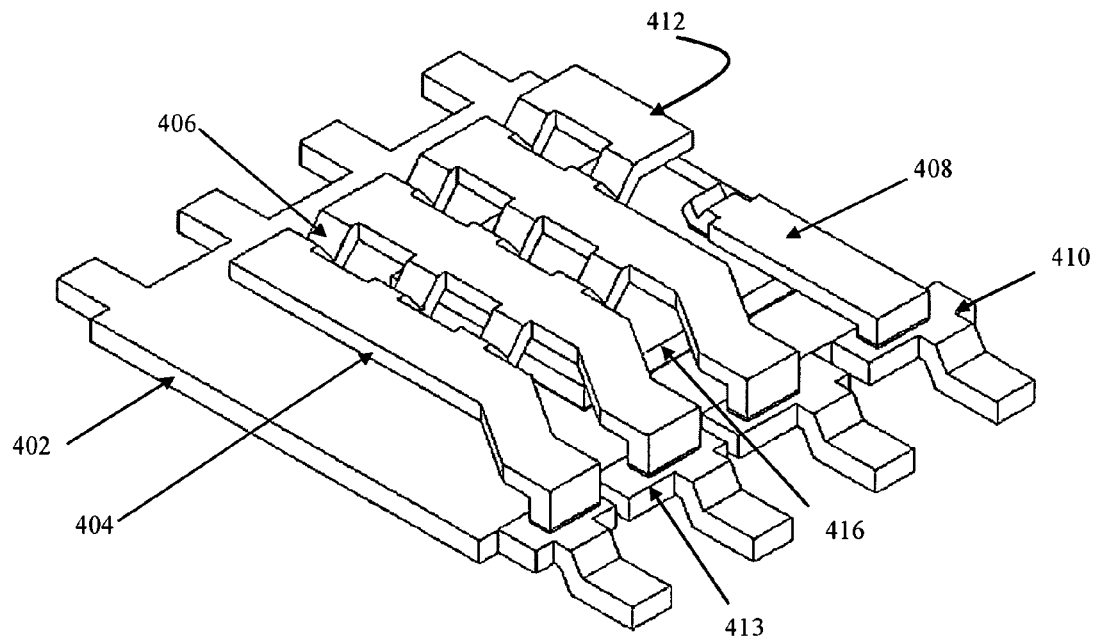
FIG. 4E is a perspective view of a semiconductor device package having a source clip with fingers matching with a non-fused leadframe according to another embodiment of the present invention.
Figure 4F:
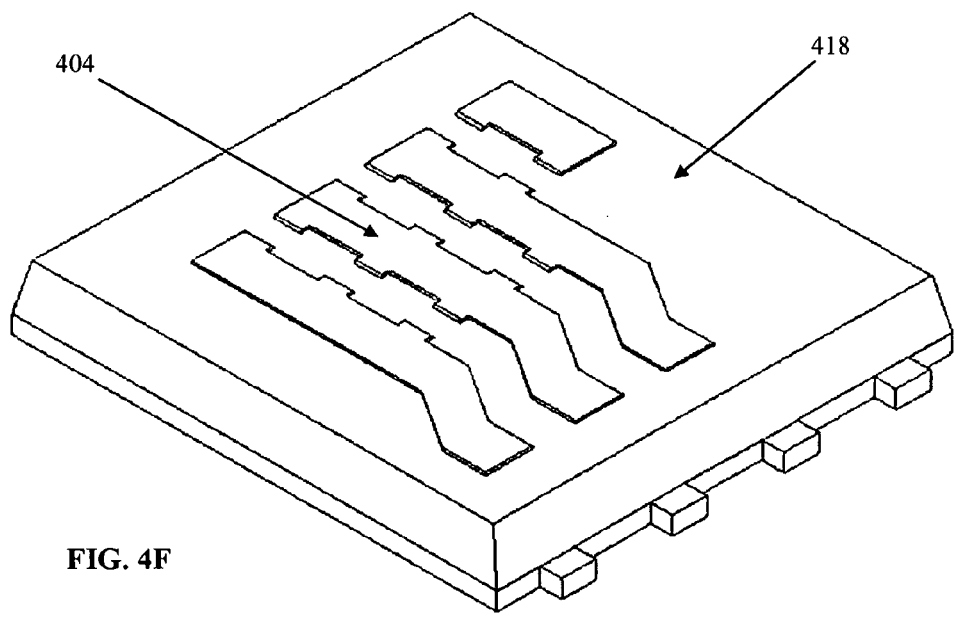
FIG. 4F is a perspective view of the device package of the type shown in FIGS. 4A, 4D and 4E encapsulated with molding compound.

The V-shaped clip 412 can be used for different designs of the MOS devices as shown in FIGS. 4D-4E. In particular semiconductor device packages 401 and 403 may include differently-sized semiconductor devices 415 and 416 respectively. The spread-out distribution of the bridges ensures sufficient contact to the MOS device, even if some of the bridges are not used. This adds both design flexibility and economy of scale, as the same clip can be used for devices of different sizes. Of course, the clips for fused lead frames, e.g. clip 112 of FIG. 1A, can also be used with devices of different sizes. As shown in FIG. 4F a semiconductor device package of the types depicted in FIGS. 4A-4D and 4E may be covered with molding compound 418 op top. As shown in FIG. 4F the top surface of the clip 412 may be exposed while the gate clip 408 is covered by the molding compound 418.

Figure 5A:
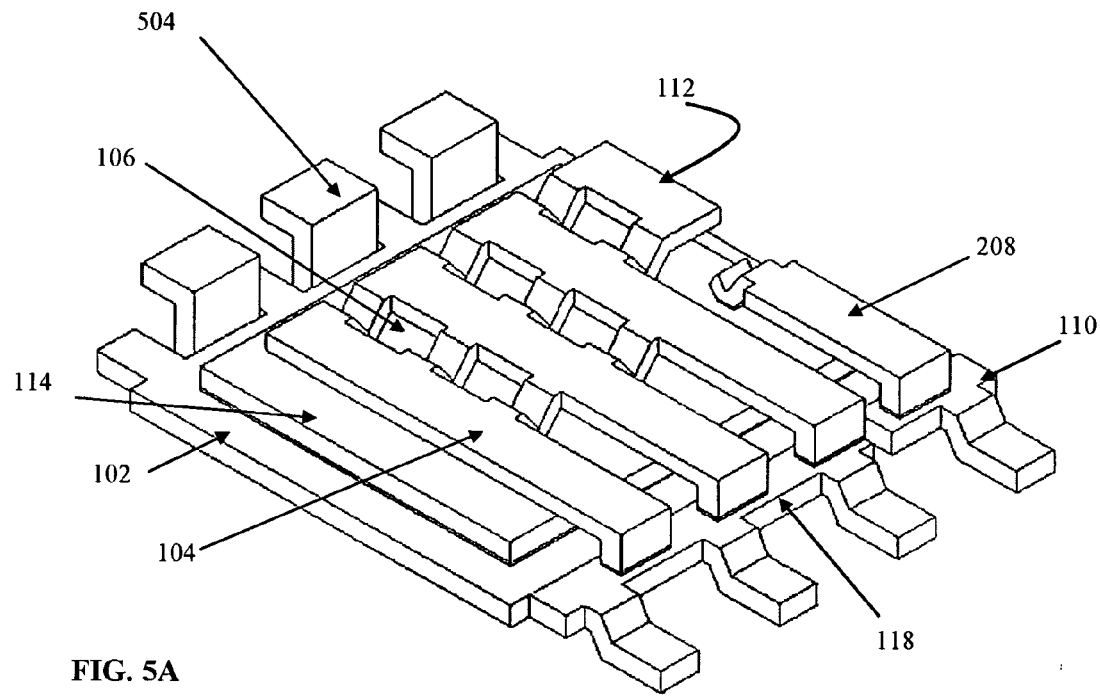
FIG. 5A is a perspective views of a semiconductor device package having a source clip with drain leads, and source and gate pads exposed on a same side according to an embodiment of the present invention.
Figure 5B:
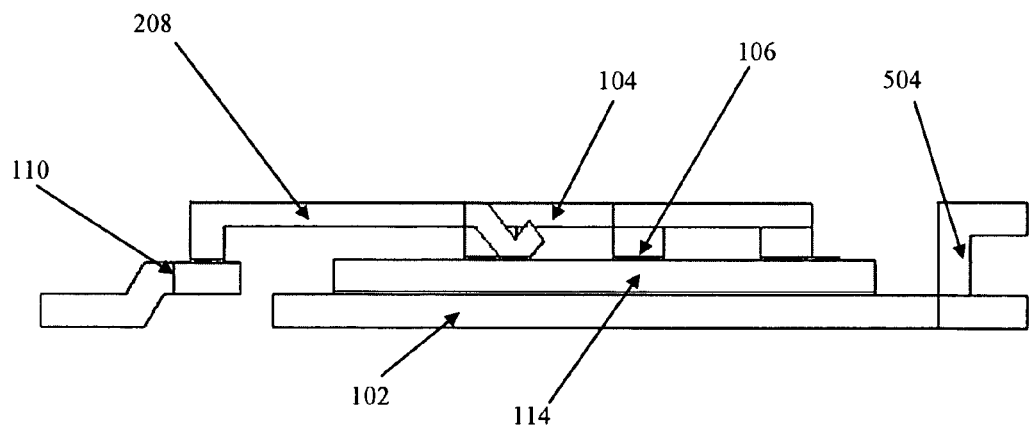
FIG. 5B is a side elevation view of the device package of FIG. 5A.
Figure 5C:
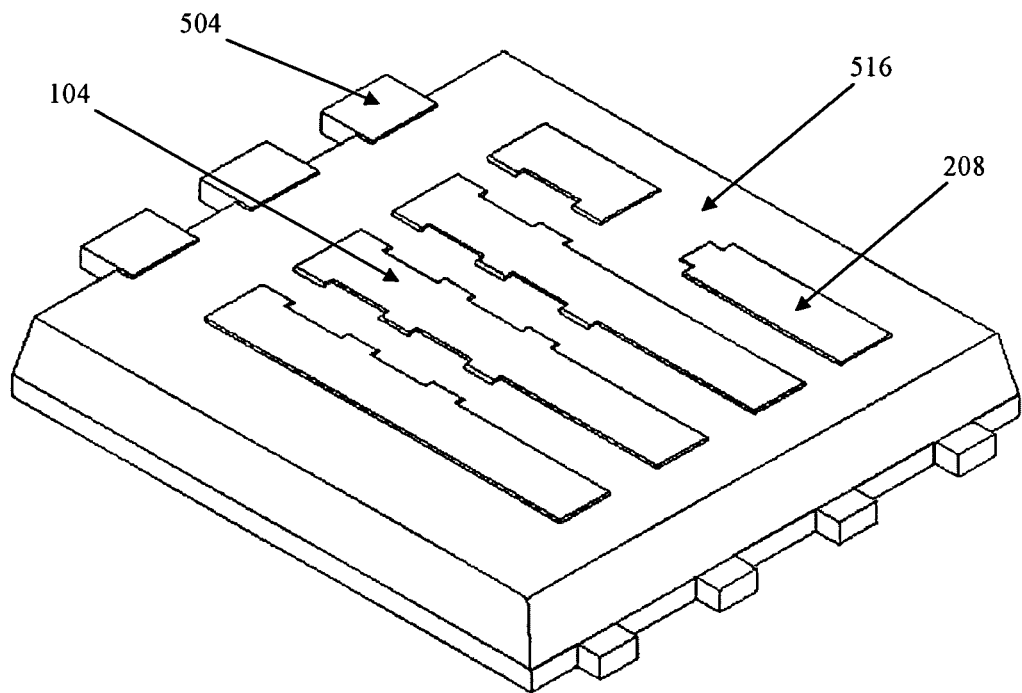
FIG. 5C is a perspective view of the device package of FIG. 5A encapsulated with molding compound.

FIG. 5A is a perspective view of a semiconductor device package 500 according to another embodiment of the present invention. The semiconductor device package 500 is a variation on the semiconductor device package 200 described above and shown in FIGS. 2A-2D. The device package 500 includes a fused lead frame 502, a semiconductor device 114 having top source, top gate and bottom drain located on top of the lead frame 102 and a clip 112 including separate fingers 104 electrically connected to each other by bridges 106. The clip 112 is electrically bonded to the top source of the semiconductor device 114 only at the bridges 106. The fingers 104 may exhibit a bend out of the plane of the clip 112 in order to vertically contact with the fused source lead 118. The top gate of the semiconductor device 114 is electrically connected to the gate lead 110 of the lead frame 102 by a gate clip 208. The drain lead of the lead frame 502 is electrically connected to the bottom drain of the semiconductor device 114, and includes drain lead extensions 504 that could be formed and bent to provide an exposed top connection that is level with the same surface as the top surface of the source clip 112 and the gate clip 208. As shown in FIG. 5B, the top surfaces of the drain lead extensions 504, gate clip 208 and the source clip 112 may be coplanar. Portions of the semiconductor device 500 may be covered with molding compound 516. As shown in FIG. 5C, the top surfaces of the drain lead extensions 504, gate clip 208 and the source clip 112 may be exposed. Since electrical contact to the drain, gate and source are all available on the top side, the semiconductor device package 500 can be mounted flip chip to a circuit board. In flip configuration, the bottom surface of lead frame 502—now facing up—can be left exposed for heat dissipation. Alternatively, a heat sink could be attached to the bottom surface (still facing up) of lead frame 502.

Figure 6:
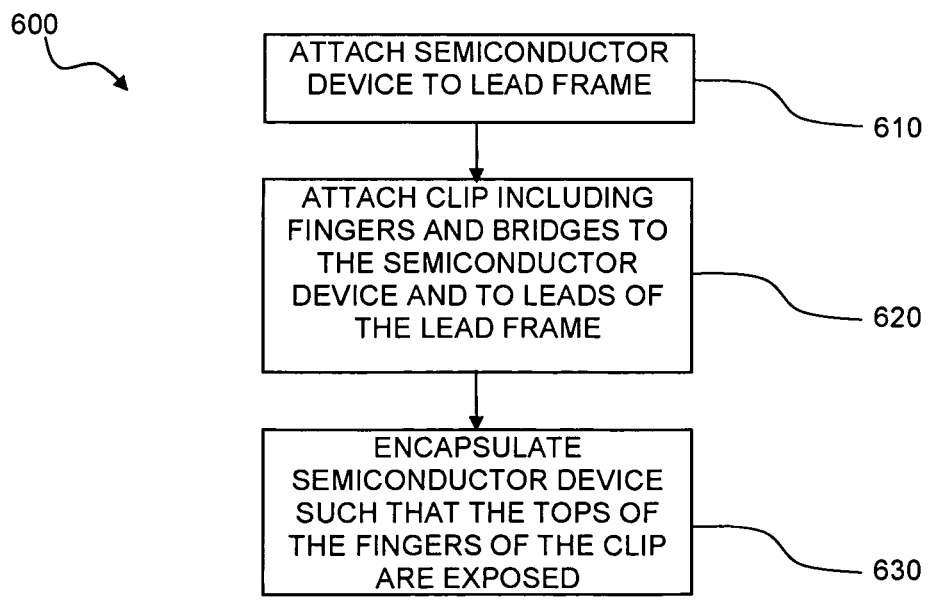
FIG. 6 is a flowchart illustrating of forming a semiconductor device package according to an embodiment of the present invention.

There are a number of different ways in which semiconductor device packages may be formed using the types of clips described above. The flow diagram depicted in FIG. 6 illustrates but one example of a method 600 for forming a semiconductor device package. This method 600 may be understood with reference to the example of semiconductor device package 100 illustrated in FIGS. 1A-1C and described above. As indicated at 610, the semiconductor device 114 including a first semiconductor region on its top side and a second semiconductor region on its bottom side may be attached to a lead frame 102 such that the second semiconductor region rests on and is electrically connected to the main part of the lead frame. By way of example, this may be accomplished by first dispensing solder paste on the main part of the lead frame 102, and then placing the semiconductor device 114 onto the solder paste.

As indicated at 620, a clip 112 with conductive fingers 104 and conductive bridges 106 may be attached to the semiconductor device 114, such that the base of the bridges 106 make contact to the first semiconductor region of the semiconductor device 114, and such that one or more of the fingers 104 contacts leads 118 of the lead frame 102. This may be accomplished by dispensing solder on the contact areas of the first semiconductor region and of the leads 118, and then attaching the clip 112. At this point, a solder reflow can be performed to form the solder joints between lead frame 102 and semiconductor device 114, between the semiconductor device 114 and clip 112, and between clip 112 and leads 118. Subsequently, as indicated at 630, a molding compound 116 may be deposited around the semiconductor device 114 and parts of the clip 112 and lead frame 102. However, the top surface of the fingers 104 of the clip 112 may be left exposed through the molding compound 116. Afterwards there can be standard steps of curing the mold, laser marking the package, dejunk, deflash, plating, and/or trimming the lead frame/singulation. Optionally, a heat sink may be attached to the exposed top surface of the fingers 104.

While this disclosure mentions the example of a top source semiconductor device, the scope of the invention is not limited to such devices. For example, embodiments of this invention could equally apply to a bottom source semiconductor device. The clip at the center of the invention, e.g. 112, 412, can also be used with various semiconductor devices other than MOS devices such as but not limited to: power bipolar junction transistor (BJT), insulated gate bipolar transistor (IGBT), thyristors, diodes, capacitors or resistors. Of course, there can be great variations in the design of the clip (112, 412). The number of fingers, the length, width and shape of the fingers, the spacing between the fingers, and the spacing between the bridges are only a few of the variables that can be adjusted. Also, while this disclosure illustrate only the clip as it fits one particular type of semiconductor package, e.g., DFN5×6 from Alpha & Omega Semiconductor of Sunnyvale, Calif., embodiments of this invention can be applied to other types of semiconductor packages, e.g. TO220, TSOP, SOT, which are also available from Alpha & Omega Semiconductor. As such, embodiments of the invention are not limited to use with any particular type of semiconductor package.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A clip for a semiconductor device package, comprising:
    two or more separate electrically conductive fingers electrically connected to each other by two or more electrically conductive bridges, wherein adjacent bridges are separated from each other by gaps, wherein a first end of at least one finger is adapted for electrical contact with a lead frame;
    wherein each of the bridges is approximately "V" shaped, wherein a base of each "V" shaped bridge is adapted to make an electrical connection to a top surface region of a semiconductor device.

2. The clip of claim 1, wherein the clip is made of a thermally and electrically conductive material.

3. The clip of claim 1, wherein the fingers and bridges are configured to provide multiple electrically parallel paths that are separated from each other by gaps between adjacent fingers and adjacent bridges.

4. The clip of claim 1, wherein one of the fingers does not extend a full length of the die in order to accommodate other features of the semiconductor package.

5. The clip of claim 1, wherein the electrically conductive bridges include two or more bridges between a first side of a finger and a second side of an adjacent finger, whereby two adjacent electrically conductive fingers are connected by two or more bridges.

6. The clip of claim 1, wherein the two or more separate electrically conductive fingers include first, second, and third fingers and wherein the bridges include a first set of bridges between the first and second fingers and a second set of bridges between the second and third fingers.

7. A semiconductor device package comprising:
    a lead frame comprising a main part and leads;
    a semiconductor device comprising at least a first semiconductor region on a top surface; and
    a clip comprising two or more separate conductive fingers electrically connected by two or more bridges, wherein adjacent bridges are separated from each other by gaps, wherein a first end of at least one finger is in electrical contact with leads of the lead frame;
    wherein each of the bridges is approximately "V" shaped, wherein a base of each "V" shaped bridge is adapted to make an electrical connection to the first semiconductor region.

8. The semiconductor device package of claim 7, wherein at least one of the fingers exhibits a bend out of a top plane of the clip in order to contact with the lead frame at contact point.

9. The semiconductor device package of claim 7, wherein the semiconductor device is encapsulated with a molding compound and top surfaces of the fingers are not covered by the molding compound.

10. The semiconductor device package of claim 9, wherein the semiconductor device further comprises at least a second semiconductor region on the bottom surface, which is located on and electrically connected to the main part of the lead frame, wherein the semiconductor device is a metal oxide semiconductor (MOS) device;
    wherein the first semiconductor region is the source, and the second semiconductor region is the drain; and
    wherein the MOS device further comprises a gate region on the top surface thereof.

11. The semiconductor device package of claim 10, wherein the gate is electrically connected to the lead frame through a bond wire.

12. The semiconductor device package of claim 11, wherein the bond wire is covered by the molding compound.

13. The semiconductor device package of claim 10, wherein the gate is electrically connected to the lead frame by a gate clip.

14. The semiconductor device package of claim 13, wherein a top surface of the gate clip is on the same level with the top surface of the fingers, and wherein the top surface of the gate clip is exposed after encapsulation with a molding compound.

15. The semiconductor device package of claim 13, wherein a top surface of the gate clip is below a top surface of the fingers and wherein the top surface of the gate clip is covered by the molding compound.

16. The semiconductor device package of claim 9, wherein one or more of the lead frame emerge from the main part of the lead frame and are electrically connected to the main part of the lead frame and to the second semiconductor region; and wherein these leads are bent up such that they are exposed at the top surface of the molding compound.

17. The semiconductor device package of claim 7, wherein the lead frame is a fused lead frame.

18. The semiconductor device package of claim 7, wherein one or more of the fingers exhibits a bend in a top plane of the clip between the bridges and the contact point at the lead frame in order to align the fingers to contact with the leads of the lead frame.

19. The semiconductor device package of claim 7, wherein the clip is made of a thermally and electrically conductive material.

20. The semiconductor device package of claim 7, wherein the clip is configured to be used with semiconductor devices of various sizes.

21. The semiconductor device package of claim 7, wherein the clip provides multiple parallel electrical and thermal paths throughout the first region of the semiconductor device.

22. The semiconductor device package of claim 7, wherein the first semiconductor region is a source region.

23. The semiconductor device package of claim 7, wherein the lead frame is a non-fused lead frame.

* * * * *